United States Patent
Schriever et al.

(10) Patent No.: US 6,804,327 B2
(45) Date of Patent: Oct. 12, 2004

(54) METHOD AND APPARATUS FOR GENERATING HIGH OUTPUT POWER GAS DISCHARGE BASED SOURCE OF EXTREME ULTRAVIOLET RADIATION AND/OR SOFT X-RAYS

(75) Inventors: Guido Schriever, Göttingen (DE); Ulrich Rebhan, Göttingen (DE)

(73) Assignee: Lambda Physik AG, Goettingen (DE)

(*) Notice: Subject to any disclaimer, the term of this patent is extended or adjusted under 35 U.S.C. 154(b) by 95 days.

(21) Appl. No.: 10/109,581

(22) Filed: Mar. 27, 2002

(65) Prior Publication Data

US 2002/0168049 A1 Nov. 14, 2002

Related U.S. Application Data

(60) Provisional application No. 60/281,446, filed on Apr. 3, 2001.

(51) Int. Cl.[7] .................................................. G21G 4/00
(52) U.S. Cl. ...................... 378/119; 378/145; 250/493.1; 250/505.1
(58) Field of Search ................................. 378/119, 121, 378/122, 145, 34, 84; 250/493.1, 504 R, 505.1

(56) References Cited

U.S. PATENT DOCUMENTS

| | | | |
|---|---|---|---|
| 3,150,483 A | 9/1964 | Mayfield et al. | 60/35.5 |
| 3,232,046 A | 2/1966 | Meyer | 60/35.5 |
| 3,279,176 A | 10/1966 | Boden | 60/202 |
| 3,961,197 A | 6/1976 | Dawson | 250/493 |
| 3,969,628 A | 7/1976 | Roberts et al. | 250/402 |

(List continued on next page.)

FOREIGN PATENT DOCUMENTS

EP  0 241 555 B1  6/1992  ............. B03C/3/38

OTHER PUBLICATIONS

Malcolm McGeoch, "Radio–frequency–preionized xenon z–pinch source for extreme ultraviolet lithography," *Applied Optics*, vol. 37, No. 9, Mar. 20, 1998, pp. 1651–1658.
M. McGeoch, "Radio–frequency–preionized xenon z–pinch source for extreme ultraviolet lithography," *Applied Optics*, vol. 37, No. 9, Mar. 20, 1998, pp. 1651–1658.

(List continued on next page.)

Primary Examiner—David V. Bruce
Assistant Examiner—Courtney Thomas
(74) Attorney, Agent, or Firm—Stallman & Pollock LLP

(57) ABSTRACT

The method and system herein pertain to an EUV photon source which includes a plasma chamber filled with a gas mixture, multiple electrodes within the plasma chamber defining a plasma region and a central axis, a power supply circuit connected to the electrodes for delivering a main pulse to the electrodes for energizing the plasma around the central axis to produce an EUV beam. The system can also include a preionizer for ionizing the gas mixture in preparing to form a dense plasma around the central axis upon application of the main pulse from the power supply circuit to the electrodes. A set of baffles may be disposed along the beam path outside of the pinch region to diffuse gaseous and contaminant particulate flow emanating from the pinch region and to absorb or reflect acoustic waves emanating from the pinch region away from the pinch region.

73 Claims, 3 Drawing Sheets

U.S. PATENT DOCUMENTS

| | | | |
|---|---|---|---|
| 4,143,275 A | 3/1979 | Mallozzi et al. | 250/503 |
| 4,203,393 A | 5/1980 | Giardini | 123/30 |
| 4,229,708 A | 10/1980 | Mani et al. | 331/94.5 |
| 4,264,375 A | 4/1981 | Silfvast et al. | 136/254 |
| 4,267,525 A | 5/1981 | Silfvast et al. | 331/94.5 |
| 4,336,506 A | 6/1982 | Silfvast et al. | 372/62 |
| 4,364,342 A | 12/1982 | Asik | 123/143 B |
| 4,369,514 A | 1/1983 | Silfvast et al. | 372/89 |
| 4,369,758 A | 1/1983 | Endo | 123/620 |
| 4,388,720 A | 6/1983 | Silfvast et al. | 372/76 |
| 4,395,770 A | 7/1983 | Silfvast et al. | 372/62 |
| 4,494,043 A | 1/1985 | Stallings et al. | 315/111.41 |
| 4,498,182 A | 2/1985 | Macklin et al. | 372/62 |
| 4,504,964 A | 3/1985 | Cartz et al. | 378/119 |
| 4,507,588 A | 3/1985 | Asmussen et al. | 315/39 |
| 4,534,034 A | 8/1985 | Hohla et al. | 372/59 |
| 4,536,884 A | 8/1985 | Weiss et al. | 378/119 |
| 4,538,291 A | 8/1985 | Iwamatsu | 378/119 |
| 4,561,406 A | 12/1985 | Ward | 123/536 |
| 4,592,056 A | 5/1986 | Elton | 372/5 |
| 4,616,908 A | 10/1986 | King | 350/576 |
| 4,618,971 A | 10/1986 | Weiss et al. | 378/34 |
| 4,633,492 A | 12/1986 | Weiss et al. | 378/119 |
| 4,635,282 A | 1/1987 | Okada et al. | 378/34 |
| 4,718,072 A | 1/1988 | Marchetti et al. | 372/86 |
| 4,752,946 A | 6/1988 | Gupta et al. | 378/119 |
| 4,774,914 A | 10/1988 | Ward | 123/162 |
| 4,837,794 A | 6/1989 | Riordan et al. | 378/119 |
| 4,860,328 A | 8/1989 | Frankel et al. | 378/34 |
| 4,872,189 A | 10/1989 | Frankel et al. | 378/119 |
| 4,977,573 A | 12/1990 | Bittenson et al. | 372/81 |
| 5,023,897 A | 6/1991 | Neff et al. | 378/122 |
| 5,027,366 A | 6/1991 | Akins et al. | 372/57 |
| 5,117,432 A | 5/1992 | Nilsen | 372/5 |
| 5,136,605 A | 8/1992 | Basting et al. | 372/59 |
| 5,142,166 A | 8/1992 | Birx | 307/419 |
| 5,161,238 A | 11/1992 | Mehmke | 359/738 |
| 5,175,755 A | 12/1992 | Kumakhov | 378/34 |
| 5,177,774 A | 1/1993 | Suckewer et al. | 378/43 |
| 5,221,823 A | 6/1993 | Usui | 219/121.78 |
| 5,241,244 A | 8/1993 | Cirri | 315/111.41 |
| 5,243,638 A | 9/1993 | Wang et al. | 378/119 |
| 5,247,535 A | 9/1993 | Muller-Horsche et al. | 372/86 |
| 5,327,475 A | 7/1994 | Golovanivsky et al. | 378/34 |
| 5,337,330 A | 8/1994 | Larson | 372/86 |
| 5,347,532 A | 9/1994 | Rebhan et al. | 372/87 |
| 5,377,215 A | 12/1994 | Das et al. | 372/57 |
| 5,430,752 A | 7/1995 | Basting et al. | 372/59 |
| 5,442,910 A | 8/1995 | Anderson | 60/266 |
| 5,499,282 A | 3/1996 | Silfvast | 378/119 |
| 5,502,356 A | 3/1996 | McGeoch | 315/111.91 |
| 5,504,795 A * | 4/1996 | McGeoch | 378/119 |
| 5,559,584 A | 9/1996 | Miyaji et al. | 355/73 |
| 5,577,092 A | 11/1996 | Kublak et al. | 378/119 |
| 5,637,962 A | 6/1997 | Prono et al. | 315/111.21 |
| 5,719,896 A | 2/1998 | Watson | 372/86 |
| 5,736,930 A | 4/1998 | Cappels | 340/642 |
| 5,763,855 A | 6/1998 | Shioji | 219/121.84 |
| 5,763,930 A | 6/1998 | Partlo | 250/504 R |
| 5,811,753 A | 9/1998 | Weick et al. | 219/121.78 |
| 5,963,616 A | 10/1999 | Silfvast et al. | 378/122 |
| 5,978,406 A | 11/1999 | Rokni et al. | 372/58 |
| 6,031,241 A | 2/2000 | Silfvast et al. | 250/504 R |
| 6,064,072 A | 5/2000 | Partlo et al. | 250/504 R |
| 6,075,838 A * | 6/2000 | McGeoch | 378/119 |
| 6,084,198 A | 7/2000 | Birx | 219/121.48 |
| 6,172,324 B1 | 1/2001 | Birx | 219/121.57 |
| 6,212,214 B1 | 4/2001 | Vogler et al. | 372/59 |
| 6,219,368 B1 | 4/2001 | Govorkov | 372/59 |
| 6,327,290 B1 | 12/2001 | Govorkov et al. | 372/61 |
| 6,339,634 B1 * | 1/2002 | Kandaka et al. | 378/119 |
| 6,345,065 B1 | 2/2002 | Kleinschmidt et al. | 372/57 |
| 6,389,052 B2 | 5/2002 | Albrecht et al. | 372/58 |
| 6,399,916 B1 | 6/2002 | Gortler et al. | 219/121.84 |
| 6,408,052 B1 * | 6/2002 | McGeoch | 378/119 |
| 6,414,438 B1 | 7/2002 | Borisov et al. | 315/111.31 |
| 6,442,182 B1 | 8/2002 | Govorkov et al. | 372/29.021 |
| 6,456,643 B1 | 9/2002 | Osmanow et al. | 372/86 |
| 6,466,599 B1 | 10/2002 | Bragin et al. | 372/58 |
| 6,490,307 B1 | 12/2002 | de Mos et al. | 372/59 |
| 6,495,795 B2 | 12/2002 | Gortler et al. | 219/121.84 |
| 6,529,533 B1 | 3/2003 | Voss | 372/29.01 |
| 6,650,679 B1 | 11/2003 | Bragin et al. | 372/87 |

OTHER PUBLICATIONS

C. Stallings et al., "Imploding argon plasma experiments," *Appl. Phys. Lett.*, vol. 35, No. 7, Oct. 1, 1979, pp. 524–526.

I.N. Weinberg et al., "A Small Scale Z–Pinch Device as an Intense Soft X–Ray Source," *Nuclear Instruments and Methods in Physics Research*, vol. A242 (1986), pp. 535–538.

W. Hartmann et al., "Homogeneous cylindrical plasma source for short–wavelength laser experiments," *Appl. Phys. Lett.*, vol. 58, No. 23, Jun. 10, 1991, pp. 2619–2621.

J. Shiloh et al., "Z Pinch of a Gas Jet," *Physical Review Letters*, vol. 40, No. 8, Feb. 20, 1978, pp. 515–518.

E. Tejnil et al., "Options for at–wavelength inspection of patterned extreme ultraviolet lithography masks," *SPIE (Part of the 19th Annual BACUS Symposium on Photomask Technology—Monterey, California*, Sep. 1999, pp. 792–803.

P. Choi et al., "Temporal development of hard and soft x–ray emission from a gas puff Z pinch," *Rev. Sci. Instrum.*, vol. 57, No. 8, Aug. 1986, pp. 2162–2164.

J.S. Pearlman et al., "X–ray lithography using a pulsed plasma source," *J. Vac. Sci. Technol.*, vol. 19, No. 4, Nov./Dec. 1981, pp. 1190–1193.

S.M. Matthews et al., "Plasma sources for x–ray lithography," *SPIE (Submicron Lithography)*, 1982, pp. 136–139.

J.W. Mather, "Formation of High–Density Deuterium Plasma Focus," *The Physics of Fluids*, vol. 8, No. 2, Feb. 1965, pp. 366–377.

G. Giordano et al., "Magnetic pulse compressor for prepulse discharge in spiker–sustainer excitation technique for XeCl lasers," *Rev. Sci. Instrum.*, vol. 65, No. 8, Aug. 1994, pp. 2475–2481.

J. Bailey et al., "Evaluation of the gas puff a pinch as an x–ray lithography and microscopy source,", *Appl. Phys. Lett.*, vol. 40, No. 1, Jan. 1, 1982; pp. 33–35.

L. Lowe, "Gas plasmas yield X rays for lithography," *Electronics*, Jan. 27, 1982, pp. 40–41.

R. Jahn, book entitled *Physics of Electric Propulsion*, Chapter 9 entitled "Unsteady Electromagnetic Acceleration," 1968, pp. 257–325.

C. Stallings et al., "Imploding argon plasma experiments," *Appl. Phys Lett.*, vol. 35, No. 7, Oct. 1, 1979, pp. 524–526.

W.T. Silfvast et al., "Laser Plasma Source Characterization for SXPL," *Optical Society of America—OSA Proceedings on Soft X–ray Projection Lithography*, vol. 18, May 10–12, 1993, pp. 117–126 (incl. cover page & table of contents).

H. Mahr et al., "Use of Metastable Ions for a Soft X–Ray Laser," *Optics Communications*, vol. 10, No. 3, Mar. 1974, pp. 227–228.

J.R. Willison et al., "Emission Spectra of Core Excited Even–Parity $^2P$ States of neutral Lithium," *Physical Review Letters*, vol. 44, No. 17, Apr. 28, 1980, pp. 2 pages of table of contents, 1125–1128.

S.A. Mani et al., "Lithium-ion soft x-ray laser," *Journal of Applied Physics*, vol. 47, No. 7, Jul. 1976, pp. cover page, i–v and 3099–3106.

Y. Nagata et al., "Soft–X–Ray Amplification of the Lyman–α Transition by Optical–Field–Induced Ionization," *Physical Review Letters*, vol. 71, No. 23, Dec. 6, 1993, pp. 3774–3777.

J.J. Rocca et al., "Study of the Soft X–Ray Emission from Carbon Ions in a Capillary Discharge," *IEEE Journal of Quantum Electronics*, vol. 29, No. 1, Jan. 1993, pp. 182–191.

M.C. Marconi et al., "Time–resolved extreme ultraviolet emission from a highly ionized lithium capillary discharge," *Appl. Phys. Lett.*, vol. 54, No. 22, May 29 1989, pp. 2180–2182.

W.T. Silfvast et al., "Simple Metal–vapor recombination lasers using segmented plasma excitation," *Appl. Phys. Lett.*, vol. 36, No. 8, Apr. 15, 1980, pp. 615–617.

In re U.S. patent application No. 09/692,265, filed Oct. 19, 2000, entitled Corona Preionization Assembly for a Gas Laser, by Igor Bragin et al., 60 pages in length.

In re U.S. patent application No. 09/780,120, filed Feb. 9, 2001, entitled "Gas Discharge Laser with Stabilized Average Pulse Energy," by Vadim Berger et al., 61 pages in length.

In re U.S. Provisional patent application No. 60/312,277, filed Aug. 13, 2001, entitled "PtSi–n–Si Schottky Barrier Photodiodes for Extreme Ultraviolet Radiation Detection," by Guido Schriever, 35 pages in length.

* cited by examiner

METHOD AND APPARATUS FOR GENERATING HIGH OUTPUT POWER GAS DISCHARGE BASED SOURCE OF EXTREME ULTRAVIOLET RADIATION AND/OR SOFT X-RAYS

PRIORITY

This application claims the benefit of priority to U.S. provisional patent application No. 60/281,446, filed Apr. 3, 2001.

BACKGROUND OF THE INVENTION

1. Field of the Invention

The present invention relates to extreme ultraviolet (EUV) lithography, and particularly to an EUV radiation source configured for transmitting an improved EUV beam.

2. Discussion of the Related Art

Semiconductor manufacturers are currently using deep ultraviolet (DUV) lithography tools based on KrF-excimer laser systems operating around 248 nm, as well as the following generation of ArF-excimer laser systems operating around 193 nm. Industrial applications in the Vacuum UV (VUV) range involve the use of the $F_2$-laser operating around 157 nm. EUV radiation sources for EUV lithography emitting 11–15 nm photon beams are currently being developed.

EUV radiation sources have an advantageous output emission beam including 11–15 nm wavelength photons having photon energies greater than 90 eV. This short wavelength is advantageous for industrial applications, such as particularly photolithography, mask writing and mask and wafer inspection applications, because the critical dimension (CD), which represents the smallest resolvable feature size producible using photolithography, is proportional to the wavelength. This permits smaller and faster microprocessors and larger capacity DRAMs in a smaller package.

A promising technique for producing EUV lithography beams use a pair of plasma pinch electrodes for driving a preionized azimuthally symmetrical plasma shell to collapse to a central axis. A power supply circuit supplies a high energy, short duration pulse to the electrodes, wherein several kilovolts and up to 100 kiloAmps are applied over a pulse duration of less than a microsecond. A Z-pinch electrode arrangement generates a current through the plasma shell in an axial direction producing an azimuthal magnetic field that provides the radial force on the charged particles of the plasma responsible for the rapid collapse.

The excimer and molecular fluorine lithography lasers, mentioned above, emit laser beams using a gas discharge for creating a population inversion to a metastable state in the laser active gas, and a resonator for facilitating stimulated emission. It is not yet clear what radiative mechanism is responsible for the axial, high energy photon emission in plasma pinch EUV sources. The collapsing shell of charged particles of the plasma have a high kinetic energy due to their velocities in the radial direction. The rapid collapse of the shell results in collisions between all portions of the incoming shell at the central axis with radially opposed portions of the incoming shell.

The high kinetic energies of the particles are abruptly transformed into a hot, dense plasma which emits x-rays. A high recombination rate concentrated in the azimuthal direction due to the plasma being particularly optically dense in the azimuthal direction has been proposed (see, Malcolm McGeoch, Radio Frequency Preionized Xenon Z-Pinch Source for Extreme Ultraviolet Lithography, Applied Optics, Vol. 37, No. 9 (20 Mar. 1998), which is hereby incorporated by reference), and population inversion resulting in spontaneous emission and predominantly axial stimulated emission, and bremsstrahlung resulting from the rapid radially deceleration of the charged particles of the collapsing plasma, are other mechanisms of high energy photon emission.

It is desired to have an improved EUV photon source, particularly having output emission characteristics more suitable for industrial applications such as photolithography.

SUMMARY OF THE INVENTION

In view of the above, an EUV photon source is provided including a plasma chamber filled with a gas mixture, multiple electrodes within the plasma chamber defining a plasma region and a central axis, a power supply circuit connected to the electrodes for delivering a main pulse to the electrodes for energizing the plasma around the central axis to produce an EUV beam output, and a preionizer for ionizing the gas mixture in preparing to form a dense plasma around the central axis upon application of the main pulse from the power supply circuit to the electrodes.

According to a first embodiment, an ionization unit is positioned along a beam path of the EUV beam outside of the plasma region for ionizing contaminant particulates along the beam path. An electrostatic particle filter is further provided for collecting the ionized particulates. The ionizing device may be preferably of corona-type.

According to a second embodiment, one or more, and preferably a set of, baffles is disposed along a beam path outside of the pinch region. The baffle(s) may function to diffuse gaseous and contaminant particulate flow emanating from the pinch region. The baffle(s) may also function to absorb or reflect acoustic waves emanating from the pinch region away from the pinch region.

According to a third embodiment, a clipping aperture is disposed along a beam path outside of the pinch region for at least partially defining an acceptance angle of the EUV beam. The aperture may be formed of ceramic and may particularly be formed of $Al_2O_3$.

According to a fourth embodiment, the power supply circuit generates the main pulse and a relatively low energy prepulse before the main pulse for homogenizing the preionized plasma prior to the main pulse.

According to a fifth embodiment, a multi-layer EUV mirror is disposed opposite a beam output side of the pinch region for reflecting radiation in a direction of the beam output side for output along the beam path of the EUV beam. The EUV mirror preferably has a curved contour for substantially collimating or focusing the reflected radiation. In particular, the EUV mirror may preferably have a hyperbolic contour.

DETAILED DESCRIPTION OF THE PREFERRED EMBODIMENTS

Preferred embodiments of an EUV photon generating source are described below. The system generally includes a preionizer for generating a pinch plasma symmetrically defined around a central axis, a power supply circuit connected to electrodes for creating an azimuthal magnetic field for rapidly collapsing the plasma to the central axis to produce an EUV beam output along the central axis.

In a first embodiment, the system preferably further includes an ionizing unit preferably of corona type generating UV light for ionizing dust particles that tend to travel along with the beam. An electrostatic particle filter is provided for collecting the charged dust particles resulting in a cleaner beam path having many advantages.

In a second embodiment, the system preferably further includes one or more, and preferably a set of, baffles for diffusing the effect of acoustic waves emanating from the pinch region such as the flow of gases and contaminant particulates traveling with the acoustic waves, as well as to prevent reflections back into the pinch region.

In a third embodiment, the system preferably further includes a clipping aperture spaced a proximate distance from the pinch region to match the divergence of the beam and reduce the influence of reflections and acoustic waves along the beam path away from the pinch region beyond the aperture location. The aperture comprises a thermally stable material with relatively high thermal conductivity and relatively low coefficient of thermal expansion, and is positioned to maintain that thermal stability. The aperture preferably comprises $Al_2O_3$.

In a fourth embodiment, the system generates a low energy prepulse which is applied to the electrodes just before the main electrical pulse. The prepulse creates more homogeneous conditions in the already preionized plasma preventing electrode burnout at hotspots from arcing due to the high voltage, fast rise time of the main pulse.

In a fifth embodiment, the system includes a reflecting surface opposite a beam output side of the central axis for reflecting radiation in a direction of the beam output side and preferably configured for focusing or collimating the beam. The reflecting surface is preferably of EUV multilayer type. The reflecting surface may be flat or hyperbolically-shaped or otherwise curved to focus the reflected radiation.

Figure 1:
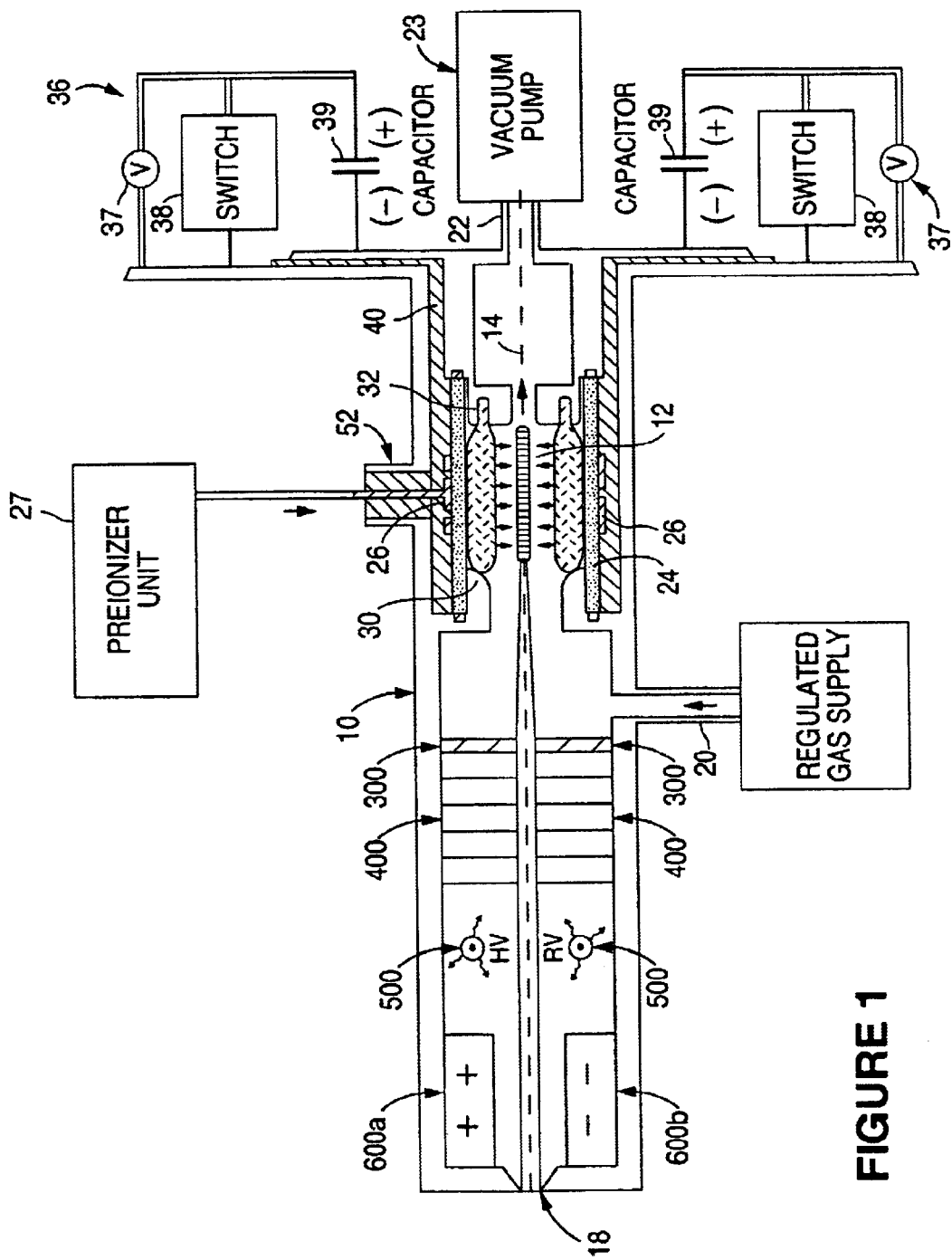
FIG. 1 schematically illustrates an EUV generating source in accord with a preferred embodiment.

Referring now to FIG. 1, an EUV generating source is schematically illustrated in cross section in accord with a preferred embodiment. Many preferred components of the EUV source are described at U.S. Pat. No. 5,504,795 which is hereby incorporated by reference. The EUV source includes a pinch chamber 10 having a pinch region 12 defining a central axis 14 at the end of which is an EUV photon transmitting window 18. A dielectric liner 24 surrounds the pinch region 12.

A gas supply inlet 20 and an outlet 22 controllably supply active and diluent gases to the pinch region 12. The outlet 22 is connected to a vacuum pump 23. Other gas supply systems are possible such as may be borrowed and/or modified from excimer laser technology (see U.S. Pat. Nos. 4,977,573 and 6,212,214, and U.S. patent applications Ser. Nos. 09/447,882 (now issued U.S. Pat. No. 6,490,307), Ser. No. 09/734,459 (now issued U.S. Pat. No. 6,389,052), Ser. No. 09/780,120 (abandoned) and Ser. No. 09/453,670 (now issued U.S. Pat. No. 6,466,599), which are each assigned to the same assignee as the present application, and U.S. Pat. Nos. 5,978,406 and 5,377,215, all of which are hereby incorporated by reference). The gas may be circulated and electrostatic and or cryogenic purification filters may be inserted into the gas loop (see U.S. Pat. Nos. 4,534,034, 5,136,605 and 5,430,752, which are hereby incorporated by reference). A heat exchanger may also be provided in the gas loop (see the '670 application, mentioned above, and U.S. Pat. No. 5,763,930, which is hereby incorporated by reference).

The gas mixture includes an x-ray emitting gas such as xenon, krypton, argon, neon, oxygen or lithium. The gas mixture also preferably includes a low atomic number diluent gas such as helium, hydrogen, deuterium, and possibly nitrogen. Preferably xenon and helium are used.

A preionization electrode 26 is connected to a preionization unit 27 for preionizing the gas in the pinch region 12. Many preionization unit types are possible such as e-beam, conical pinch discharge and RF preionization (see the '795 patent and C. Stallings, et al., Imploding Argon Plasma Experiments, Appl. Phys. Lett. 35 (7), Oct. 1, 1979, which is hereby incorporated by reference). Some known laser preionization systems may be modified to provide preionization for the EUV source, as well (see U.S. Pat. Nos. 5,247,535, 5,347,532 and U.S. patent applications Ser. Nos. 09/247,887 (issued U.S. Pat. No. 6,650,679), Ser. No. 09/692,265 ([pending]) and Ser. No. 09/532,276 (issued U.S. Pat. No. 6,456,643), which are assigned to the same assignee as the present application and are hereby incorporated by reference). The preionization unit 27 and electrode 26 preionizes the pinch plasma in a symmetrical shell around the central axis 14, as shown, prior to the application of the main pulse to the main electrodes 30 and 32.

The preferred main electrodes 30, 32 are as shown in FIG. 1. The anode 30 and the cathode 32 are shown located at opposite ends of the pinch region 12. Many other anode-cathode configurations are possible (see U.S. Pat. Nos. 3,961,197, 5,763,930, 4,504,964 and 4,635,282, which are hereby incorporated by reference). A power supply circuit 36 including a voltage source 37, a switch 38 and capacitor 39 connected to electrodes 30, 32 generates electrical pulses that produce high electric fields in the pinch region which in turn create azimuthal magnetic fields causing the preionized plasma to rapidly collapse to the central axis 14 to produce an EUV beam output along the central axis 14. Many power supply circuits are possible (see U.S. Pat. No. 5,142,166 which is hereby incorporated by reference). The anode 30 and cathode 32 are separated by an insulator 40.

A prepulse is preferably generated in accord with a preferred embodiment. The prepulse occurs just prior to the main pulse and after the plasma is substantially preionized by the preionization unit 27 and electrode 26. The prepulse is a relatively low energy discharge provided by the main electrodes 30, 32. The prepulse creates more homogeneous conditions in the already preionized plasma preventing electrode burnout at hotspots from arcing due to the high voltage, fast rise time of the main pulse. A prepulse circuit is described at Giordano et al., referred to and incorporated by reference, below, and may be modified to suit the EUV source of the preferred embodiment.

In summary with respect to the first through fifth embodiments, an EUV photon source, e.g., a Z-pinch, HCT-pinch, capillary discharge, plasma focus, and/or laser produced plasma device, may include one or more advantageous features according to preferred embodiments herein.

The EUV source may include a preionizer and multiple electrodes for generating a plasma symmetrically defined around a central axis, a power supply circuit connected to electrodes for generally creating an azimuthal magnetic field or an electric filed and/or discharge for energizing a plasma formed around the central axis which emits EUV radiation, to produce an EUV beam output. Among the advantageous features according to preferred embodiments are an ionizing unit preferably of corona type generating UV light ionizes contaminant particulates along the beam path and an electrostatic particle filter collects the charged particulates. Also, one or more, and preferably a set of, baffles may be used to diffuse the effect of acoustic waves emanating from the pinch region such as the flow of gases and contaminant particulates traveling with the acoustic waves, and to prevent reflections back into the plasma region. A clipping aperture may also be included formed of a thermally stable material such as a ceramic such as sapphire or alumina and spaced a proximate distance from the pinch region to match the divergence of the beam and reduce the influence of reflections of particulates and acoustic waves along the beam path. A low energy prepulse may also be applied to the electrodes just before the main electrical pulse creating more homogeneous conditions in the preionized plasma shell preventing electrode burnout at hotspots from arcing due to the high voltage, fast rise time of the main pulse.

Many other configurations of the above (and below) elements of the preferred embodiments are possible. For this reason, in addition to that which is described and/or incorporated by reference above and below herein, the following are hereby incorporated by reference:

Weinberg et al., A Small Scale Z-Pinch Device as an Intense Soft X-ray Source, Nuclear Instruments and Methods in Physics Research A242 (1986) 535–538;

Hartmann, et al., Homogeneous Cylindrical Plasma Source for Short-Wavelength laser, Appl. Phys. Lett. 58 (23), 10 Jun. 1991;

Shiloh et al., Z Pinch of a Gas Jet, Phys. Rev. Lett. 40 (8), 20 Feb. 1978;

Edita Tejnil, et al., Options for at-wavelength inspection of patterned extreme ultraviolet lithography masks, SPIE Vol. 3873, Part of the 19$^{th}$ Annual Symposium on Photomask Technology (September 1993)

Choi et al., Temporal Development of Hard and Soft X-ray Emission from a Gas-Puff Z Pinch, 2162 Rev. Sci. Instrum. 57 (8) August 1986;

McGeoch, Appl. Optics, see above;

Pearlman, et al., X-ray Lithography Using a Pulsed Plasma Source, 1190 J. Vac. Sci. Technol. 19 (4) November/December 1981;

Matthews et al., Plasma Sources for X-ray Lithography, 136 SPIE Vol. 333 Submicron Lithography (1982);

Mather, Formation of a High Density Deuterium Plasma Focus, Physics of Fluids, 8 (3) February 1965;

Giordano et al. Magnetic Pulse Compressor for Prepulse Discharge in Spiker Sustainer Technique for XeCl Lasers, Rev. Sci. Instrum. 65 (8), August 1994;

Bailey et al., Evaluation of the Gas Puff Z Pinch as an X-ray Lithography and Microscopy Source, Appl. Phys. Lett. 40(1), (Jan. 1, 1982);

U.S. Pat. Nos. 3,150,483, 3,232,046, 3,279,176, 3,969,628, 4,143,275, 4,203,393, 4,364,342, 4,369,758, 4,507,588, 4,536,884, 4,538,291, 4,561,406, 4,618,971, 4,633,492, 4,752,946, 4,774,914, 4,837,794, 5,023,897, 5,175,755, 5,241,244, 5,442,910, 5,499, 282, 5,502,356, 5,577,092, 5,637,962; as well as any additional sources referred to elsewhere herein. In addition to the above references and those cited elsewhere in the present application, the following are hereby incorporated by reference into this Detailed Description of the Preferred Embodiments, as disclosing alternative embodiments of elements or features of the preferred embodiments not otherwise set forth in detail above or below herein. A single one or a combination of two or more of these references may be consulted to obtain a variation of the preferred embodiments within the scope of the present invention:

U.S. Pat. Nos. 3,961,197, 4,229,708, 4,264,375, 4,267,525, 4,336,506, 4,369,514, 4,388,720, 4,395,770, 4,494,043, 4,498,182, 4,504,964, 4,592,056, 4,635,282, 4,860,328, 4,872,189, 5,117,432, 5,177,774, 5,243,638, 5,327,475, 5,377,215, 5,499,282, 5,504,795, 5,736,930, 5,963,616, 6,031,241, 6,064,072, 6,084,198, and 6,172,324;

U.S. patent applications Ser. Nos. 60/312,277 and 09/693,490 (issued U.S. Pat. No. 6,414,438), which are assigned to the same assignee as the present application;

Gas Plasmas Yield X Rays for Lithography, Electronics, 40, (Jan. 27, 1982);

Robert G. Jahn, Physics of Electric Propulsion, 257–325, McGraw-Hill (1968);

C. Stallings, et al., Imploding Argon Plasma Experiments, Appl. Phys. Lett. 35(7), 524–526 (Oct. 1, 1979);

W. T. Silfvast, et al., Laser Plasma Source Characterization for SXPL, OSA Proceedings on Soft X-Ray Projection Lithography, 1993, Vol. 18 (1993), Andrew M. Hawryluk and Richard H. Stulen, eds.;

H. Mahr et al., use of Metastable Ions for a Soft X-Ray Laser, Optics Communications, Vol. 10, No. 3 (March 1974);

Emission Spectra of core Excited Even-Parity 2P States of neutral Lithium, Phys. Rev. Lett., Vol. 44, No. 17 (28 Apr. 1980);

S. A. Mani et al., Lithium-Ion Soft X-Ray Laser, J. Appl. Phys., Vol. 47, No. 7 (July 1976);

W. Hartmann et al., Homogeneous Cylindrical Plasma Source for Short-Wavelength Laser, Appl. Phys. Lett., 58(23) (10 Jun. 1991);

Yutaka Nagata, et al., Soft X-Ray Amplification o the Lyman-α Transition by Optical-Field-Induced Ionization, Phys. Rev. Lett., Vol. 71, No. 23 (6 Dec. 1993);

James J. Rocca, et al., Study of the Soft X-Ray Emission From Carbon Ions in a Capillary Discharge, IEEE J. Quantum Electronics, Vol. 29, No. 1 (January 1993);

Marlo C. Marconi, et al., Time-Resolved Extreme Ultraviolet Emission from a Highly Ionized Lithium Capillary Discharge. Appl. Phys. Lett., 54(22), (29 May 1989); and W. T. Silfvast, et al., Simple Metal-Vapor Recombination Lasers Using Segmented Plasma Excitation, Appl. Phys. Lett. 36(8), (15 Apr. 1980).

Referring again to FIG. 1, between the pinch region 12 and the EUV transmitting window 18 are several advantageous features in accord with preferred embodiments. A clipping aperture 300 is spaced a proximate distance from the pinch region 12. The clipping aperture 300 may be formed as shown or may be offset at an angle such as is described at U.S. Pat. No. 5,161,238, which is assigned to the same assignee as the present application and is hereby incorporated by reference. That is, the aperture 300 may include walls that reflect clipped-out portions of the beam away from the beam path. Further measures may be taken to prevent the clipped-out portions from reflecting from other surfaces after being reflected away by the aperture 300 to disturb the beam, such as by providing a beam dump (not shown). The clipping aperture 300 comprises a material exhibiting a high thermal stability. That is, the clipping aperture preferably has a high thermal conductivity and a low coefficient of thermal expansion. The clipping aperture preferably comprises a ceramic material such as $Al_2O_3$, sapphire or alumina.

The clipping aperture is positioned close to the pinch region, but not too close to the pinch region 12 that thermal effects degrade its performance. The clipping aperture 300 blocks acoustic waves and particulates traveling with the acoustic waves from following the beam on the remainder of its journey through the pinch chamber 10. The aperture 300 is further preferably configured to reflect and/or absorb the acoustic waves so that they do not reflect back into the pinch region 12. The size of the clipping aperture 300 is selected to match the divergence of the beam. The aperture 300 may also be water, oil or fan cooled, or otherwise thermally controlled as may be understood by those skilled in the art.

A set of baffles 400 is preferably provided after the clipping aperture. The baffles 400 may be configured similar to those described at U.S. Pat. No. 5,027,366, which is hereby incorporated by reference, or otherwise as understood by those skilled in the art. The baffles 400 serve to diffuse the effect of acoustic waves emanating from the pinch region such as the flow of gases and contaminant particulates traveling with the acoustic waves, as well as to prevent reflections back into the pinch region. The baffles 400 preferably absorb such disturbances.

An ionizing unit 500 is shown located after the baffles 400. The ionizing unit 500 may be located before the baffles 400 or between two sets of baffles 400. The ionizing unit preferably emits UV radiation. As such, the ionizing unit 500 is preferably corona type, such as corona wires or electrodes. Some corona designs are described at U.S. Pat. Nos. 4,718,072, 5,337,330 and 5,719,896, and U.S. patent applications Ser. Nos. 09/247,887 (issued U.S. Pat. No. 6,650,679), and Ser. No. 09/692,265, each application being assigned to the same assignee as the present application, and all of these parents and patent applications are hereby incorporated by reference.

The UV light from the ionizer unit 500 ionizes dust particles that tend to travel along with the beam. An electrostatic particle filter 600a, 600b is provided for collecting the charged dust particles resulting in a cleaner beam path. Fewer of these contaminants are deposited on the window 18 and elsewhere in the chamber 14. Also, the ionizer, precipitator arrangement reduces reflections from the particulates by the EUV beam, as well as other disturbances to the beam.

In accordance with preferred embodiments, the EUV source schematically illustrated at FIG. 1 and described above exhibits output emission characteristics advantageously suitable for industrial applications, and particularly having output emission characteristics more suitable for photolithographic, mask writing and mask and wafer inspection applications. The clipping aperture 300 and/or set of baffles 400 reduce the influence of acoustic waves emanating from the pinch region 12. The clipping aperture 300 also matches and/or defines the divergence of the beam. The prepulse generated prior to the main pulse serves to homogenize the plasma shell to reduce the probability that arcing will degrade the pinch symmetry and the resulting EUV beam and that hotspots due to the arcing will deteriorate the electrodes 30, 32. The ionizer 500 and precipitator 600a, 600b serve to remove particulates from the beam path preventing adverse effects on the beam and components such as the beam exit window 18 of the chamber 10 where the particulates may become otherwise deposited.

FIGS. 2–5 schematically illustrate EUV generating sources corresponding to four general techniques, i.e., Z-pinch, HCT-pinch (hollow cathode triggered pinch), capillary discharge (CD) and plasma focus or dense plasma focus. Although not specifically illustrated, other EUV sources may be used with features of the preferred embodiments such as laser produced plasma (LPP) sources. One or more features of the preferred embodiments described above and below herein may be advantageously included with any of these general techniques for generating EUV radiation. The systems specifically shown at each of FIGS. 2–5 include a reflecting surface opposite a beam output side of the central axis for reflecting the beam toward the output side of the central axis, and preferably also substantially focusing or collimating the beam. The reflecting surface is preferably of EUV multilayer type, and the reflecting surface may be flat, or preferably may be hyperbolically-shaped or otherwise curved to either focus or collimate the reflected radiation. Any of the embodiments shown at FIGS. 2–5 may further or alternatively include any of the features described above with reference to FIG. 1 including the aperture 300, the baffles 400, the ionizer 500 and/or the precipitator 600a, 600b. Moreover, an advantageous EUV generating source in accordance with a preferred embodiment may include one of more features of the embodiment described above with reference to FIG. 1 in combination with the reflecting surface schematically shown at FIGS. 2–5. Also, any of the embodiments of FIGS. 2–5 may be combined with one or more features of the embodiment of FIG. 1 either with or without also including the reflecting surface, although EUV sources including any of the advantageous reflecting surfaces of FIGS. 2–5 are preferred.

Figure 2:
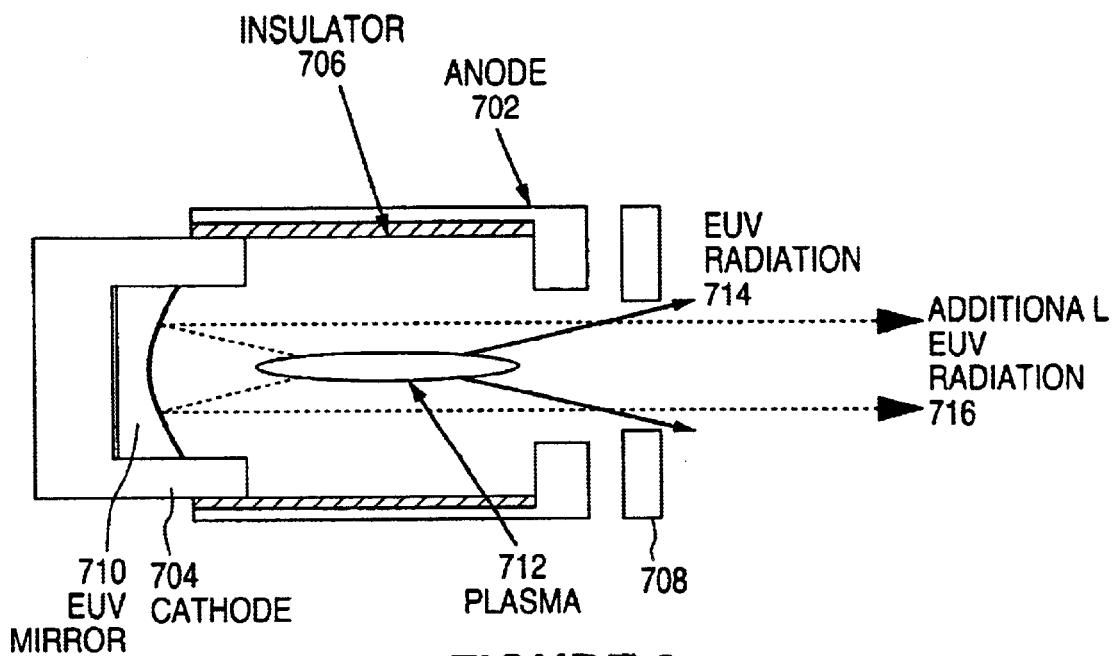
FIG. 2 schematically illustrates an EUV generating source including a reflecting surface opposite a beam output side of the central axis according to a first embodiment.

FIG. 2 schematically illustrates an EUV generating source, and particularly a Z-pinch device, including a reflecting surface opposite a beam output side of the central axis according to a sixth embodiment. The EUV source schematically shown at FIG. 2 includes an anode 702 and a cathode 704 electrically separated by an insulator 706. The exemplary and illustrative Z-pinch device shown at FIG. 2 also includes a clipping aperture 708 for matching and/or defining a divergence for the EUV beam. The clipping aperture 708 may include one or more features of the aperture 300 of FIG. 1. Although not shown at FIG. 2, the Z-pinch device may also include any of baffles 400, ionizer 500 and precipitator 600a, 600b described with reference to the system shown at FIG. 1, e.g., after the clipping aperture 708, 300 along the EUV beam path. The EUV source of FIG. 2 further includes an EUV mirror 710 or EUV reflecting surface 710.

In operation, the Z-pinch EUV source of FIG. 2 rapidly generates a dense plasma 712, e.g., when several kilovolts and several kiloAmps are applied to the electrodes 702, 704. EUV radiation 714 emanates from the dense plasma 712 particularly in each of the two opposing, axial directions (i.e., to the left and to the right in FIG. 2). On the output side of the plasma 712 (i.e., the right in FIG. 2) is an opening defined in the anode 702 for allowing the radiation emanating from the plasma 712 and propagating to the right in FIG. 2 to escape the Z-pinch chamber. The clipping aperture 714 is preferably configured in size, and perhaps shape, in oneand preferably two-dimensions, to match a preferred dimension, profile and/or divergence of the EUV beam.

The EUV mirror 710 reflects the radiation 716 emanating from the plasma 712 and initially propagating away from the output side of the Z-pinch chamber. The EUV radiation 716 is redirected to propagate toward the output side of the chamber so that the radiation 716 may be applied to an industrial application along with the original EUV radiation 714. The mirror 710 may be flat, elliptical, concave spherical, cylindrical, aspherical, conical or otherwise curved to focus the beam if desired, while the mirror 710 is preferably hyperbolic when an advantageously collimated beam is desired, as illustrated at FIG. 2. Details of this preferred mirror 710 is described in more detail below following general descriptions of the embodiments of FIGS. 3–5.

Figure 3:
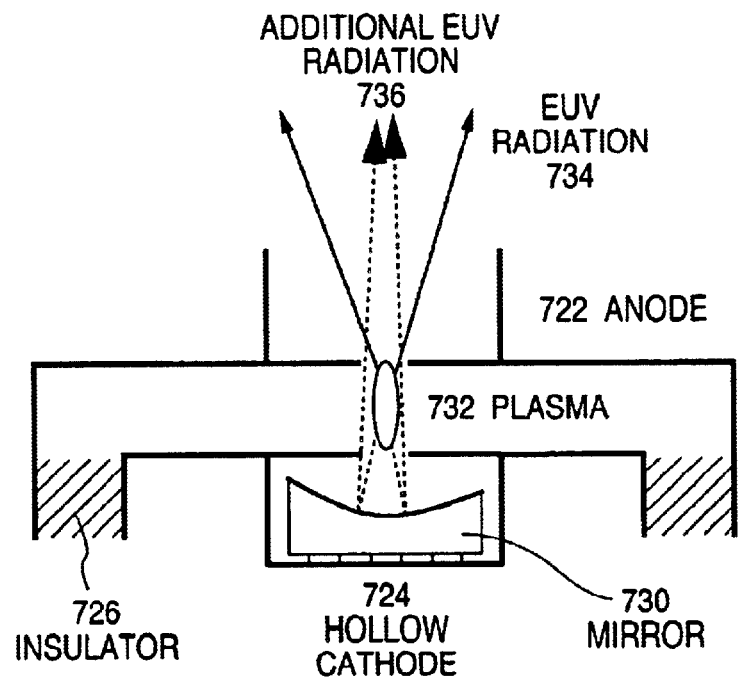
FIG. 3 schematically illustrates an EUV generating source including a reflecting surface opposite a beam output side of the central axis according to a second embodiment.

FIG. 3 schematically illustrates an EUV generating source, and particularly a hollow cathode triggered (HCT) pinch device, including a reflecting surface opposite a beam output side of the central axis according to a seventh embodiment. The exemplary and illustrative HCT-pinch EUV source schematically shown at FIG. 3 includes an anode 722 and a hollow cathode 724 electrically separated by an insulator 726. Although not shown at FIG. 3, the HCT-pinch device may also include any of clipping aperture 300, baffles 400, ionizer 500 and precipitator 600a, 600b described with reference to FIG. 1. The EUV source of FIG. 3 further includes an EUV mirror 730 or EUV reflecting surface 730.

In operation, the HCT-pinch EUV source of FIG. 3 rapidly generates a dense plasma 732, when a potential difference is applied to the electrodes 722, 724. EUV radiation 714 emanates from the dense plasma 732 particularly in each of the two opposing, axial directions (i.e., to the top and to the bottom of the page in FIG. 3). On the output side of the plasma 732 (i.e., at the top of the device of FIG. 2) is an opening for allowing the EUV radiation 734 emanating from the plasma 732 and propagating upward in FIG. 3 to escape the HCT-pinch device.

The EUV mirror 730 reflects the radiation emanating from the plasma 732 and initially propagating away from the output side of the HCT-pinch device. This additional radiation 736 is redirected by the mirror 730 to propagate toward the output side of the chamber. This additional EUV radiation 736 may be applied to an industrial application along with the original EUV radiation 734. As with the mirror 710 of the Z-pinch embodiment of FIG. 2, the mirror 730 may be flat, elliptical, concave spherical, cylindrical, aspherical, conical or otherwise curved to focus the beam if desired, while the mirror 730 is preferably hyperbolic when an advantageously collimated beam is desired.

Figure 4:
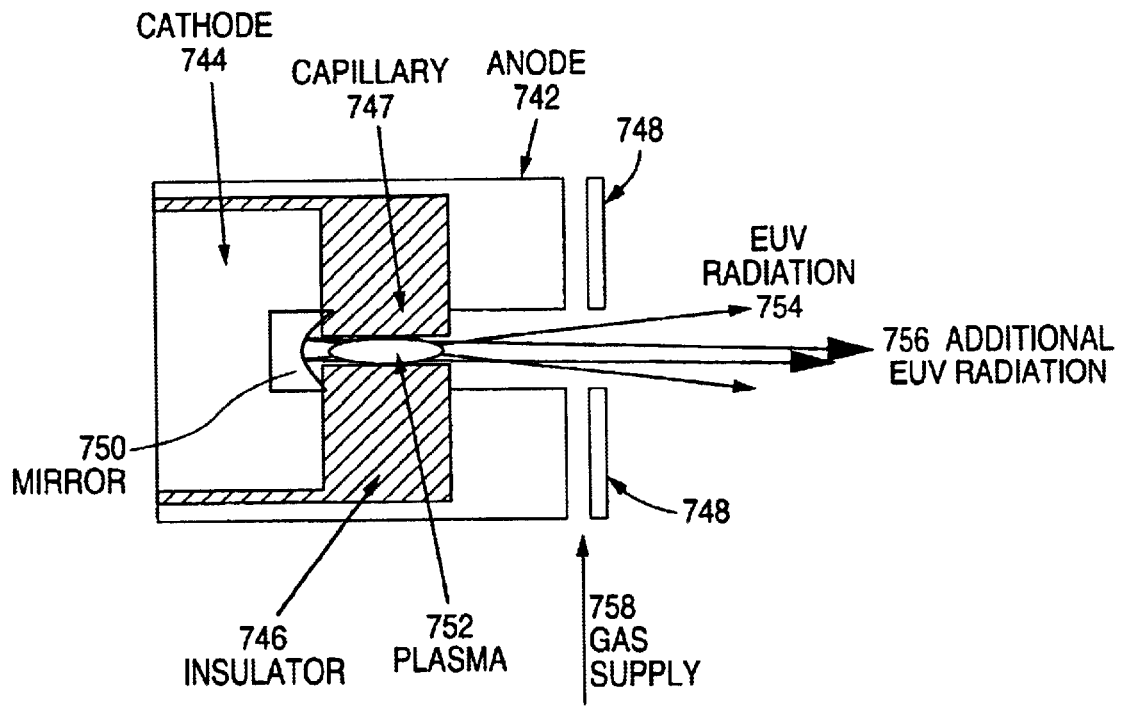
FIG. 4 schematically illustrates an EUV generating source including a reflecting surface opposite a beam output side of the central axis according to a third embodiment.

FIG. 4 schematically illustrates an EUV generating source, and particularly a capillary discharge (CD) device, including a reflecting surface opposite a beam output side of the central axis according to a eighth embodiment. The exemplary and illustrative capillary discharge EUV source schematically shown at FIG. 4 includes an anode 742 and a cathode 744 electrically separated by an insulator 746 including a capillary 747 within which a plasma 752 is created. The capillary discharge device shown at FIG. 4 also includes a clipping aperture 748 for matching and/or defining a divergence for the EUV beam. The clipping aperture 748 may include one or more features of the aperture 300 of FIG. 1 and/or the aperture 708 of FIG. 2. The gases used to form the plasma 752 of the device of FIG. 4, as well as for the devices of FIGS. 1 and 3–5, or another device in accordance with a preferred embodiment, may be supplied through gas supply 758, as shown, or otherwise as understood by those skilled in the art. Although not shown at FIG. 4, the Z-pinch device may also include any of baffles 400, ionizer 500 and precipitator 600a, 600b described with reference to the system shown at FIG. 1, e.g., after the clipping aperture 752, 708, 300 along the EUV beam path. The EUV source of FIG. 4 further includes an EUV mirror 750 or EUV reflecting surface 750.

In operation, the capillary discharge EUV source of FIG. 4 rapidly generates a dense plasma 752 within the capillary 747, when a potential difference is applied to the electrodes 742, 744. EUV radiation 754 emanates from the dense plasma 752 particularly in each of the two opposing, axial directions (i.e., to the left and to the right in FIG. 4). On the output side of the plasma 752 (i.e., to the right of the device of FIG. 4) is an opening for allowing the EUV radiation 754 emanating from the plasma 752 and propagating to the right in FIG. 4 to escape the capillary discharge device.

The EUV mirror 750 reflects the radiation 756 emanating from the plasma 752 within the capillary 747 and initially propagating away from the output side of the capillary discharge device. This additional radiation 756 is redirected by the mirror 750 back through the capillary 747 to propagate toward the output side of the chamber. This additional EUV radiation 756 may be applied to an industrial application along with the original EUV radiation 754. As with the mirror 710 of the Z-pinch embodiment of FIG. 2 and the mirror 730 of the HCT-pinch device of FIG. 3, the mirror 750 may be flat, elliptical, concave spherical, cylindrical, aspherical, conical or otherwise curved to focus the beam if desired, while the mirror 750 is preferably hyperbolic when an advantageously collimated beam is desired.

Figure 5:
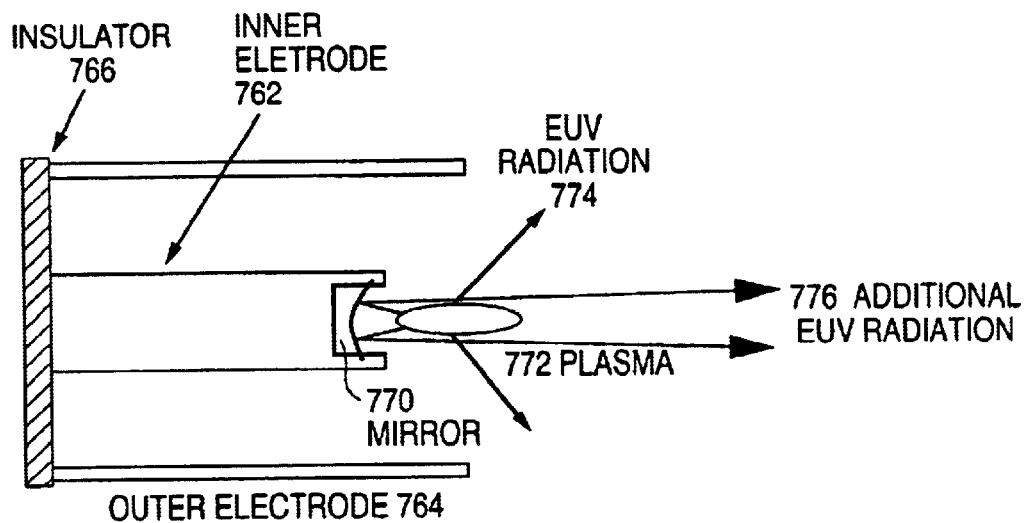
FIG. 5 schematically illustrates an EUV generating source including a reflecting surface opposite a beam output side of the central axis according to a fourth embodiment.

FIG. 5 schematically illustrates an EUV generating source, and particularly a plasma focus source, including a reflecting surface opposite a beam output side of the central axis according to a ninth embodiment. The exemplary and illustrative plasma focus EUV source schematically shown at FIG. 5 includes an inner electrode 762 and an outer electrode 764 electrically separated by an insulator 766. Although not shown, the plasma focus device of FIG. 5 may also include a clipping aperture for matching and/or defining a divergence for the EUV beam, similar to the aperture 300, 708 or 748 of FIG. 1, 2 or 4 described above. Although also not shown at FIG. 5, the plasma focus device may also include any of baffles 400, ionizer 500 and precipitator 600a, 600b, described with reference to the system shown at FIG. 1, along the EUV beam path to the right in FIG. 5. The EUV source of FIG. 5 further includes an EUV mirror 770 or EUV reflecting surface 770.

In operation, the capillary discharge EUV source of FIG. 5 rapidly generates a dense plasma 772 when a potential difference is applied to the electrodes 762, 764. EUV radiation 774 emanates from the dense plasma 772 particularly in each of the two opposing, axial directions (i.e., to the left and to the right in FIG. 5). On the output side of the plasma 772 (i.e., to the right of the device of FIG. 5) is an opening for allowing the EUV radiation 774 emanating from the plasma 772 and propagating to the right in FIG. 5 to escape the plasma focus device.

The EUV mirror 770 reflects the radiation 776 emanating from the plasma 772 and initially propagating away from the output side of the plasma focus device. This additional radiation 776 is redirected by the mirror 770 to propagate toward the output side of the chamber. This additional EUV radiation 776 may be applied to an industrial application along with the original EUV radiation 774. As with the mirror 710 of the Z-pinch embodiment of FIG. 2 and the mirror 730 of the HCT-pinch device of FIG. 3 and the mirror 750 of the capillary discharge device of FIG. 4, the mirror 770 may be flat, elliptical, concave spherical, cylindrical, aspherical, conical or otherwise curved to focus the beam if desired, while the mirror 770 is preferably hyperbolic when an advantageously collimated beam is desired.

As briefly described above and as illustrated at each of FIGS. 2–5, an EUV reflective multi-layer mirror is preferably used with any of the preferred embodiments including the exemplary device illustrated at FIG. 1. The EUV multi-layer mirror increases the usable angle in gas discharge based photon sources such as Z-pinch, HCT-pinch, capillary discharge and plasma focus, as well as for laser produced plasma (LPP) sources. The EUV mirror can be flat or of curved shape with collimating and/or imaging properties. The output power of the EUV generating source is advantageously increased by using the preferred EUV mirror, while substantially all other parameters of the system may be left unaltered.

In order to raise the output power of a gas discharge-based EUV photon source, the electrical power would typically be increased. Under the same discharge conditions, this can lead to higher power in the electrode system correlated with higher temperatures. A device according to the preferred embodiment including the advantageous mirror has increased output power (compared with a same system except without the mirror), while substantially all other parameters of the system may be left unaltered.

Gas discharge based photon sources generate a hot, dense plasma, which emits radiation into a solid angle of $4\pi$ steradians (sr). Absent the advantageous mirror 710, 730, 750, 770 (hereinafter only "710" will be referenced, although what follows is intended to describe any of the mirrors 710, 730, 750, 770) of the preferred embodiments, radiation emitted in any direction other than that which includes the open solid angle of the electrode system and/or that is further defined by an aperture 300, 708, 748 (hereinafter only "300" will be referenced, although what follows is intended to describe any of the apertures 300, 708, 748), and the distance of the opening or the aperture 300 to the plasma, would be absorbed within the source and would not be included in the output radiation beam. The preferred mirror 710 reflects some of this radiation and guides it through the accessible opening and/or aperture 300. The mirror 710 is configured to reflect EUV radiation around 11 nm to 15 nm, such as 13.4 nm or 11.5 nm, and is therefore preferably an EUV multilayer mirror, e.g., including layers and/or bilayers of molybdenum (Mo)-, silicon (Si)- and/or beryllium (Be)-containing species, or other layers as understood by those skilled in the art for providing substantial reflection of the EUV radiation, and preferably particularly adapted to the wavelength of the radiation and the angle of incidence. This angle can vary laterally on the surface of the mirror and thus gradient multilayers are preferred.

In each of the above-described EUV sources, the plasma is typically formed into the shape of a small column (e.g., 0.5 mm to 3.0 mm wide). The optical thickness along the central axis for the emitted radiation is high. The reflected radiation does not pass through the plasma itself, because the plasma is opaque to the EUV radiation. The shape of the preferred mirror 710 is therefore preferably adapted so that a substantial amount of the reflected radiation gets passed the plasma and continues within the acceptance angle of the system that is defined by the opening and/or aperture 300. The preferred mirror 710 is also adapted to the emission characteristics of the source, which as mentioned, can tend to be weighted along the central axis in each direction. The imaging, focusing and/or collimating properties of the preferred mirror 710 are such that a large proportion of the reflected radiation is both guided around the plasma column and through the opening and/or aperture 300 of the EUV system.

Among many choices of contour, a flat mirror 710 will improve the output power of the source only slightly, but may be useful in conjunction with another mirror on one or more sides of the plasma column and/or when the plasma is significantly blocking the beam path to the opening and/or aperture 300, with the advantage of ease of manufacture. An elliptical or spherical mirror with adapted focal length may be used to focus the radiation in front of or just passed the output opening and/or aperture 300, and can be advantageous for application processing proximate to the EUV source and/or using additional imaging or beam shaping optics, e.g., a reflective imaging system for photolithographic reduction. A hyperbolically-shaped mirror may be used to generate almost parallel radiation or a collimated beam, such as when it is desired that the beam travel a significant distance prior to being re-directed or shaped with additional EUV optics or for direct application to a workpiece, or when a performance of an imaging system can be enhanced by using collimated input radiation and/or when collimated radiation produces the highest beam transport efficiency (note that the beam path may be preferably enclosed and the atmosphere prepared to be free of contaminants and/or photoabsorbing species of the EUV radiation, e.g., by evacuation and/or purging with inert gas; see U.S. Pat. Nos. 6,327,290, 6,219,368, 6,345,065, 6,219, 368, 5,559,584, 5,221,823, 5,763,855, 5,811,753 and 4,616, 908, and U.S. patent applications Ser. No. 09/598,552 (issued U.S. Pat. No. 6,442,182), Ser. No. 09/712,877 (issued U.S. Pat. No. 6,529,533), 09/727,600 (issued U.S. Pat. No. 6,495,795) and Ser. No. 09/131,580 (issued U.S. Pat. No. 6,399,916), which applications are assigned to the same assignee as the present application, and all of these patents and patent applications are hereby incorporated by reference). One can generally use this degree of freedom of changing the mirror shape, contour, degree of curvature, etc., to adapt the emission properties of the EUV source to the optical system of the application.

Estimates of the improvement of the output powers of the EUV sources, described above with reference to FIGS. 2–5, due to the presence of the mirror 710, 730, 750, 770 can be deduced by considering the geometries of the electrode systems (see Table A below). The solid angles of the emitted radiation depend on the electrode geometries. $I_0$ is the intensity emitted isotropically by the plasma into a solid angle of $4\pi$ sr. The output is calculated out of these two values. The estimated mirror acceptance angle is the upper value, limited by the electrode systems. The reflectivity of the mirrors is set to 70%, close to the best current demonstrated values for normal incidence radiation. The increase of output power is calculated by multiplication of the solid angles of the mirrors 710, 730, 750, 770 and their reflectivity. The "improvement" value is the quotient of the increase of output and the initial output of each source.

As shown in Table A, the highest increase of the output power due to the presence of mirrors 710, 730 is expected for the Z-pinch and HCT-pinch geometries, and is 230% and 70%, respectively. The usable angles of capillary discharges and plasma focus devices initially are very high such that the expected improvement due to the presence of the mirrors 750, 770 is smaller in relation to the output power. However, the collimating or focusing property of the mirrors 750, 770 can yield greater improvement in the quality of the output beam for the capillary discharge and plasma focus systems than appears from these calculations (and the same may be true for the Z-pinch and HCT-pinch devices).

TABLE A

| Source/ Parameter | z-pinch | HCT-pinch | Capillary discharge | plasmafocus |
|---|---|---|---|---|
| Solid angle | 0.3 sr | 1 sr | $\pi$sr | $2\pi$sr |
| Output | $0.3/4\pi\ I_0$ | $1/4\pi\ I_0$ | $\pi/4\pi\ I_0$ | $2\pi/4\pi\ I_0$ |
| Estimated Mirror acceptance angle | 1 sr | 1 sr | 0.3 sr | 1 sr |
| Multilayer reflectivity | 70% | 70% | 70% | 70% |
| Increase of output by mirror | $1/4\pi \times 0.7\ I_0$ | $1/4\pi \times 0.7\ I_0$ | $0.3/4\pi \times 0.7\ I_0$ | $1/4\pi \times 0.7\ I_0$ |
| Increase of output in % of $I_0$ | 5.6% | 5.6% | 1.7% | 5.6% |
| Expected improvement | 230% | 70% | 6.8% | 11.2% |

The preferred mirrors 710, 730, 750, 770 become treated by heat and ion bombardment from the plasma. These can tend to shorten the lifetimes of the mirrors 710, 730, 750, 770. Therefore, special heat resistant kinds of multilayer systems are preferred for use with the EUV sources described herein. In particular, preferred mirrors 710, 730, 750, 770 may be formed from combinations of $Mo_2C$—Si or Mo—Si—$Mo_2C$, or other such structures that may be understood and/or later achieved by those skilled in the art as being particularly heat and/or other damage resistant and having a long lifetime, while still providing substantial reflectivity (e.g., 50% or more, and preferably 70% or more).

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The invention is therefore not limited by any of the description of the preferred embodiments, and is instead defined by the language of the appended claims, and structural and functional equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary.

What is claimed is:

1. An EUV photon source, comprising:
    a plasma chamber filled with a gas mixture;
    multiple electrodes within the plasma chamber defining a pinch region and a central axis;
    a power supply circuit connected to the electrodes for delivering a main pulse to the electrodes for energizing the plasma around the central axis to produce an EUV beam output;
    a preionizer for ionizing the gas mixture in preparing to form a dense plasma around the central axis upon application of the main pulse from the power supply circuit to the electrodes;
    an ionization unit positioned along a beam path of the EUV beam outside of the plasma region for ionizing contaminant particulates along the beam path; and
    an electrostatic particle filter for collecting the ionized particulates.
2. The EUV source of claim 1, wherein said ionizing unit generates a corona discharge.
3. The EUV source of claim 1, further comprising one or more baffles along the beam path outside of the pinch region.
4. The EUV source of claim 3, the one or more baffles for diffusing gaseous and contaminant particulate flow emanating from the pinch region.
5. The EUV source of claim 4, the one or more baffles further for absorbing or reflecting acoustic waves emanating from the pinch region away from the pinch region.
6. The EUV source of claim 3, further comprising a clipping aperture along the beam path outside of the pinch region for at least partially defining an acceptance angle of the EUV beam.
7. The EUV source of claim 6, wherein said aperture comprises ceramic.
8. The EUV source of claim 6, wherein said aperture comprises $Al_2O_3$.
9. The EUV source of claim 6, wherein said power supply circuit generates the main pulse and a relatively low energy prepulse before said main pulse for homogenizing the preionized plasma prior to the main pulse.
10. The EUV source of claim 9, further comprising a multi-layer EUV mirror disposed opposite a beam output side of the pinch region for reflecting radiation in a direction of the beam output side for output along the beam path of the EUV beam.
11. The EUV source of claim 10, wherein the EUV mirror has a curved contour for substantially collimating the reflected radiation.
12. The EUV source of claim 10, wherein the EUV mirror has a curved contour for substantially focusing the reflected radiation.
13. The EUV source of claim 6, further comprising a multi-layer EUV mirror disposed opposite a beam output side of the pinch region for reflecting radiation in a direction of the beam output side for output along the beam path of the EUV beam.
14. The EUV source of claim 13, wherein the EUV mirror has a curved contour for substantially collimating the reflected radiation.
15. The EUV source of claim 13, wherein the EUV mirror has a curved contour for substantially focusing the reflected radiation.
16. The EUV source of claim 3, wherein said power supply circuit generates the main pulse and a relatively low energy prepulse before said main pulse for homogenizing the preionized plasma prior to the main pulse.
17. The EUV source of claim 16, further comprising a multi-layer EUV mirror disposed opposite a beam output side of the pinch region for reflecting radiation in a direction of the beam output side for output along the beam path of the EUV beam.
18. The EUV source of claim 17, wherein the EUV mirror has a curved contour for substantially collimating the reflected radiation.
19. The EUV source of claim 17, wherein the EUV mirror has a curved contour for substantially focusing the reflected radiation.
20. The EUV source of claim 3, further comprising a multi-layer EUV mirror disposed opposite a beam output side of the pinch region for reflecting radiation in a direction of the beam output side for output along the beam path of the EUV beam.
21. The EUV source of claim 20, wherein the EUV mirror has a curved contour for substantially collimating the reflected radiation.

22. The EUV source of claim 20, wherein the EUV mirror has a curved contour for substantially focusing the reflected radiation.

23. The EUV source of claim 1, further comprising a clipping aperture along the beam path outside of the pinch region for at least partially defining an acceptance angle of the EUV beam.

24. The EUV source of claim 23, wherein said aperture comprises ceramic.

25. The EUV source of claim 23, wherein said aperture comprises $Al_2O_3$.

26. The EUV source of claim 23, wherein said power supply circuit generates the main pulse and a relatively low energy prepulse before said main pulse for homogenizing the preionized plasma prior to the main pulse.

27. The EUV source of claim 26, further comprising a multi-layer EUV mirror disposed opposite a beam output side of the pinch region for reflecting radiation in a direction of the beam output side for output along the beam path of the EUV beam.

28. The EUV source of claim 27, wherein the EUV mirror has a curved contour for substantially collimating the reflected radiation.

29. The EUV source of claim 27, wherein the EUV mirror has a curved contour for substantially focusing the reflected radiation.

30. The EUV source of claim 23, further comprising a multi-layer EUV mirror disposed opposite a beam output side of the pinch region for reflecting radiation in a direction of the beam output side for output along the beam path of the EUV beam.

31. The EUV source of claim 30, wherein the EUV mirror has a curved contour for substantially collimating the reflected radiation.

32. The EUV source of claim 30, wherein the EUV mirror has a curved contour for substantially focusing the reflected radiation.

33. The EUV source of claim 1, wherein said power supply circuit generates the main pulse and a relatively low energy prepulse before said main pulse for homogenizing the preionized plasma prior to the main pulse.

34. The EUV source of claim 33, further comprising a multi-layer EUV mirror disposed opposite a beam output side of the pinch region for reflecting radiation in a direction of the beam output side for output along the beam path of the EUV beam.

35. The EUV source of claim 34, wherein the EUV mirror has a curved contour for substantially collimating the reflected radiation.

36. The EUV source of claim 34, wherein the EUV mirror has a curved contour for substantially focusing the reflected radiation.

37. The EUV source of claim 1, further comprising a multi-layer EUV mirror disposed opposite a beam output side of the pinch region for reflecting radiation in a direction of the beam output side for output along the beam path of the EUV beam.

38. The EUV source of claim 37, wherein the EUV mirror has a curved contour for substantially collimating the reflected radiation.

39. The EUV source of claim 37, wherein the EUV mirror has a curved contour for substantially focusing the reflected radiation.

40. An EUV photon source, comprising:
a plasma chamber filled with a gas mixture;
multiple electrodes within the plasma chamber defining a pinch region and a central axis;
a power supply circuit connected to the electrodes for delivering a main pulse to the electrodes for energizing the plasma around the central axis to produce an EUV beam output;
a preionizer for ionizing the gas mixture in preparing to form a dense plasma around the central axis upon application of the main pulse from the power supply circuit to the electrodes; and
one or more baffles along a beam path outside of the pinch region.

41. The EUV source of claim 40, the one or more baffles for diffusing gaseous and contaminant particulate flow emanating from the pinch region.

42. The EUV source of claim 41, the one or more baffles further for absorbing or reflecting acoustic waves emanating from the pinch region away from the pinch region.

43. The EUV source of claim 40, further comprising a clipping aperture along the beam path outside of the pinch region for at least partially defining an acceptance angle of the EUV beam.

44. The EUV source of claim 43, wherein said aperture comprises ceramic.

45. The EUV source of claim 43, wherein said aperture comprises $Al_2O_3$.

46. The EUV source of claim 43, wherein said power supply circuit generates the main pulse and a relatively low energy prepulse before said main pulse for homogenizing the preionized plasma prior to the main pulse.

47. The EUV source of claim 46, further comprising a multi-layer EUV mirror disposed opposite a beam output side of the pinch region for reflecting radiation in a direction of the beam output side for output along the beam path of the EUV beam.

48. The EUV source of claim 47, wherein the EUV mirror has a curved contour for substantially collimating the reflected radiation.

49. The EUV source of claim 47, wherein the EUV mirror has a curved contour for substantially focusing the reflected radiation.

50. The EUV source of claim 43, further comprising a multi-layer EUV mirror disposed opposite a beam output side of the pinch region for reflecting radiation in a direction of the beam output side for output along the beam path of the EUV beam.

51. The EUV source of claim 50, wherein the EUV mirror has a curved contour for substantially collimating the reflected radiation.

52. The EUV source of claim 50, wherein the EUV mirror has a curved contour for substantially focusing the reflected radiation.

53. The EUV source of claim 40, wherein said power supply circuit generates the main pulse and a relatively low energy prepulse before said main pulse for homogenizing the preionized plasma prior to the main pulse.

54. The EUV source of claim 53, further comprising a multi-layer EUV mirror disposed opposite a beam output side of the pinch region for reflecting radiation in a direction of the beam output side for output along the beam path of the EUV beam.

55. The EUV source of claim 54, wherein the EUV mirror has a curved contour for substantially collimating the reflected radiation.

56. The EUV source of claim 54, wherein the EUV mirror has a curved contour for substantially focusing the reflected radiation.

57. The EUV source of claim 40, further comprising a multi-layer EUV mirror disposed opposite a beam output side of the pinch region for reflecting radiation in a direction of the beam output side for output along the beam path of the EUV beam.

58. The EUV source of claim 57, wherein the EUV mirror has a curved contour for substantially collimating the reflected radiation.

59. The EUV source of claim 57, wherein the EUV mirror has a curved contour for substantially focusing the reflected radiation.

60. An EUV photon source, comprising:

a plasma chamber filled with a gas mixture;

multiple electrodes within the plasma chamber defining a pinch region and a central axis;

a power supply circuit connected to the electrodes for delivering a main pulse to the electrodes for energizing the plasma around the central axis to produce an EUV beam output;

a preionizer for ionizing the gas mixture in preparing to form a dense plasma around the central axis upon application of the main pulse from the power supply circuit to the electrodes; and a clipping aperture along a beam path outside of the pinch region for at least partially defining an acceptance angle of the EUV beam.

61. The EUV source of claim 60, wherein said aperture comprises ceramic.

62. The EUV source of claim 60, wherein said aperture comprises $Al_2O_3$.

63. The EUV source of claim 60, wherein said power supply circuit generates the main pulse and a relatively low energy prepulse before said main pulse for homogenizing the preionized plasma prior to the main pulse.

64. The EUV source of claim 63, further comprising a multi-layer EUV mirror disposed opposite a beam output side of the pinch region for reflecting radiation in a direction of the beam output side for output along the beam path of the EUV beam.

65. The EUV source of claim 64, wherein the EUV mirror has a curved contour for substantially collimating the reflected radiation.

66. The EUV source of claim 64, wherein the EUV mirror has a curved contour for substantially focusing the reflected radiation.

67. The EUV source of claim 60, further comprising a multi-layer EUV mirror disposed opposite a beam output side of the pinch region for reflecting radiation in a direction of the beam output side for output along the beam path of the EUV beam.

68. The EUV source of claim 67, wherein the EUV mirror has a curved contour for substantially collimating the reflected radiation.

69. The EUV source of claim 67, wherein the EUV mirror has a curved contour for substantially focusing the reflected radiation.

70. An EUV photon source, comprising:

a plasma chamber filled with a gas mixture;

multiple electrodes within the plasma chamber defining a pinch region and a central axis;

a power supply circuit connected to the electrodes for delivering a main pulse to the electrodes for energizing the plasma around the central axis to produce an EUV beam output;

a preionizer for ionizing the gas mixture in preparing to form a dense plasma around the central axis upon application of the main pulse from the power supply circuit to the electrodes, and wherein said power supply circuit generates the main pulse and a relatively low energy prepulse before said main pulse for homogenizing the preionized plasma prior to the main pulse.

71. The EUV source of claim 70, further comprising a multi-layer EUV mirror disposed opposite a beam output side of the pinch region for reflecting radiation in a direction of the beam output side for output along a beam path of the EUV beam.

72. The EUV source of claim 71, wherein the EUV mirror has a curved contour for substantially collimating the reflected radiation.

73. The EUV source of claim 71, wherein the EUV mirror has a curved contour for substantially focusing the reflected radiation.

* * * * *